United States Patent
Kao et al.

(10) Patent No.: US 8,753,963 B2
(45) Date of Patent: Jun. 17, 2014

(54) MANUFACTURING METHOD OF MULTI-TRENCH TERMINATION STRUCTURE FOR SEMICONDUCTOR DEVICE

(71) Applicant: PFC Device Corp., New Taipei (TW)

(72) Inventors: Lung-Ching Kao, New Taipei (TW); Mei-Ling Chen, New Taipei (TW); Kuo-Liang Chao, New Taipei (TW); Hung-Hsin Kuo, New Taipei (TW)

(73) Assignee: PFC Device Corp., New Taipei (TW)

( * ) Notice: Subject to any disclaimer, the term of this patent is extended or adjusted under 35 U.S.C. 154(b) by 0 days.

(21) Appl. No.: 14/038,310

(22) Filed: Sep. 26, 2013

(65) Prior Publication Data
US 2014/0030882 A1   Jan. 30, 2014

Related U.S. Application Data

(62) Division of application No. 13/411,035, filed on Mar. 2, 2012.

(51) Int. Cl.
*H01L 21/28* (2006.01)
*H01L 21/02* (2006.01)

(52) U.S. Cl.
USPC .......................................... 438/576; 257/284

(58) Field of Classification Search
USPC ........... 257/109, 476, 280–284; 438/169, 576
See application file for complete search history.

(56) References Cited

U.S. PATENT DOCUMENTS

2005/0148173 A1 *   7/2005   Shone ......................... 438/672

\* cited by examiner

*Primary Examiner* — Calvin Lee
(74) *Attorney, Agent, or Firm* — Chun-Ming Shih; HDLS IPR Services

(57) ABSTRACT

A multi-trench termination structure for semiconductor device is disclosed, where the semiconductor device includes a semiconductor substrate and an active structure region. The multi-trench termination structure includes multiple trenches defined on an exposed face of the semiconductor substrate, a first mask layer formed on a partial exposed surface of the semiconductor substrate and corresponding to a termination structure region of the semiconductor device, a gate insulation layer formed in the trenches, a conductive layer formed on the gate insulation layer and protruding out of the exposed surface of the semiconductor substrate, and a metal layer formed over the first mask layer and conductive layer on the termination structure region of the semiconductor device.

10 Claims, 8 Drawing Sheets

MANUFACTURING METHOD OF MULTI-TRENCH TERMINATION STRUCTURE FOR SEMICONDUCTOR DEVICE

CROSS REFERENCES RELATED TO THE APPLICATION

This application is a divisional application of U.S. patent application Ser. No. 13/411,035 filed on Mar. 2, 2012.

BACKGROUND OF THE INVENTION

1. Field of the Invention

The present invention relates to a method for making multi-trench termination structure for semiconductor device, and more particularly to a method for making multi-trench termination structure for semiconductor device (such as Schottky diode) to enhance the tolerance of the semiconductor device to high reverse voltage.

2. Description of Prior Art

A Schottky diode is a unipolar device using electrons as carriers, and is characterized by high switching speed and low forward voltage drop. The limitations of Schottky diodes are the relatively low reverse voltage tolerance and the relatively high reverse leakage current. The limitations are related to the Schottky barrier determined by the metal work function of the metal electrode, the band gap of the intrinsic semiconductor, the type and concentration of dopants in the semiconductor layer, and other factors. For improving the Schottky diode device performance, a trench type Schottky diode was proposed, in which a thermal oxide layer is grown in trenches, and then a polysilicon or metal material is filled in trenches of the device to pinch off the reverse leakage current, so as to reduce the current leakage of the device.

A typical structure of Schottky diode device with MOS trench has been disclosed by U.S. Pat. No. 5,365,102. Please refer to FIGS. 1A-1F illustrating the manufacturing method of the trench MOS barrier Schottky rectifier (TMBSR). As shown in FIG. 1A, a substrate 12 having two opposite surfaces 12a and 12b is provided. The substrate 12 has a relatively heavily-doped cathode region 12c (shown as N+) adjacent to the surface 12a. A relatively lightly-doped drift region 12d (shown as N) preferably extends from the cathode region 12c to the surface 12b. A silicon oxide layer 13 is then grown on the surface 12b to relieve interlayer stress between the substrate 12 and a later-formed silicon nitride layer 15. A photoresist layer 17 is then formed on the silicon nitride layer 15.

In FIG. 1B, a lithography and etching step is performed to partially remove the silicon nitride layer 15, the silicon oxide layer 13 and the substrate 12 so as to form a plurality of discrete mesas 14 in the drift region 12d of the substrate 12 and trench structures 22 with a specific dimension defined by the mesas 14. Referring to FIG. 1C, a thermal oxide layer 16 is formed on the trench sidewalls 22a and the trench bottoms 22b. After removing the remaining portions of the silicon oxide layer 13 and the silicon nitride layer 15, the resultant structure is shown as FIG. 1D. Then, a top metallization step and a backside metallization step are performed to form an anode metal layer 18 on the mesas 14 and a cathode metal layer 20 on the surface 12a (FIGS. 1E and 1F). Accordingly, a Schottky barrier contact is formed on the interface between the semiconductor mesas 14 and the anode metal layer 18. The process of manufacturing the TMBSR is thus completed.

The trench Schottky diode manufactured from the aforementioned process may have a low forward voltage drop. Furthermore, the trench structure can pinch off reverse leakage current, such that the current leakage of the TMBSR would less than that of a Schottky diode without any trench structure. However, stress deriving from trench-etching cannot be effectively released and the Schottky diode may be damaged during the reliability test. In particular, the product including the trench Schottky diode possibly malfunctions because of the small cracks caused by the stress.

Therefore, there is a need of providing an improved trench Schottky diode and associated manufacturing method to overcome the problems encountered in the prior art.

SUMMARY OF THE INVENTION

It is an object of the present invention to provide a method for making termination structure for semiconductor device (such as Schottky diode) to enhance the tolerance of the semiconductor device to high reverse voltage.

Accordingly, the present invention provides a method for manufacturing a multi-trench termination structure for semiconductor device, the method comprising:

(a) providing a semiconductor substrate with an active structure region and a termination structure region;

(b) forming a first mask layer on the semiconductor substrate, wherein the first mask layer is at least corresponding to the termination structure region of the semiconductor device;

(c) forming a multi-trench structure with a plurality of trenches by etching the semiconductor substrate with respect to the first mask layer;

(d) forming a gate insulation layer on the multi-trench structure;

(e) forming an electrically conductive layer on the gate insulation layer; and (f) forming metal layer at least covering the first mask layer and at least covering the electrically conductive layer in the termination structure region.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1A:
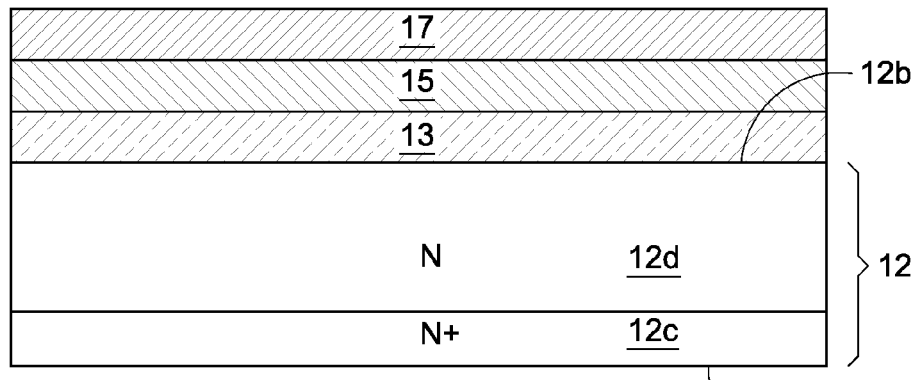
FIGS. 1A to 1F illustrate the manufacturing method of the trench MOS barrier Schottky rectifier (TMBSR).
Figure 1B:
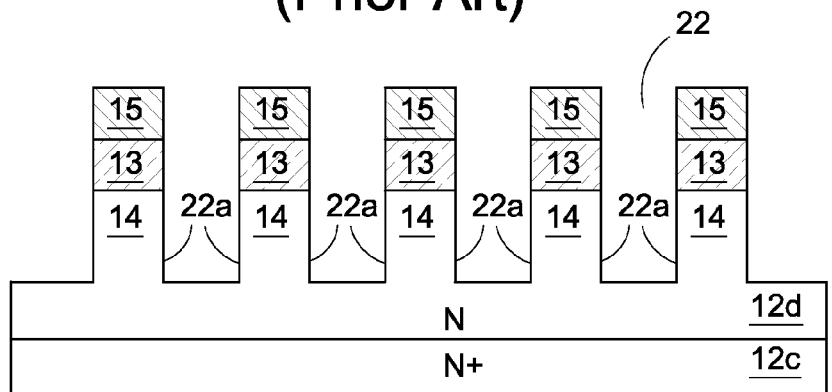
Figure 1C:
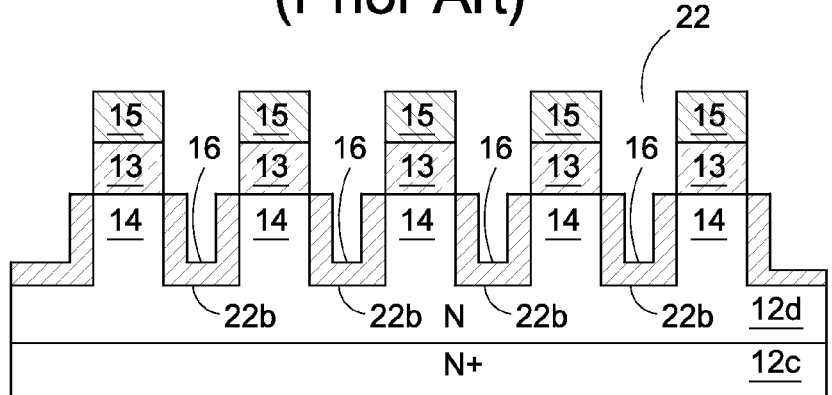
Figure 1D:
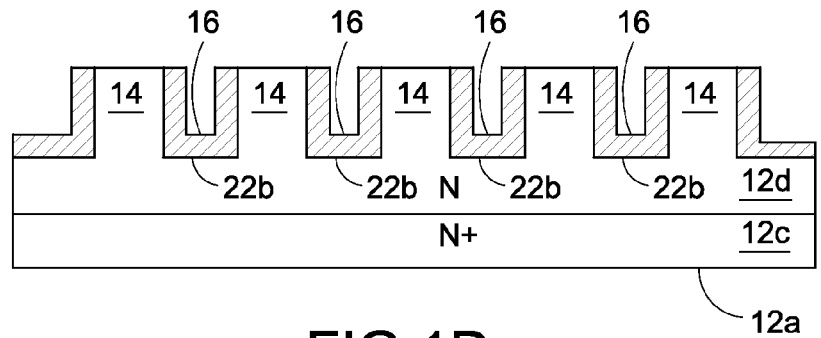
Figure 1E:
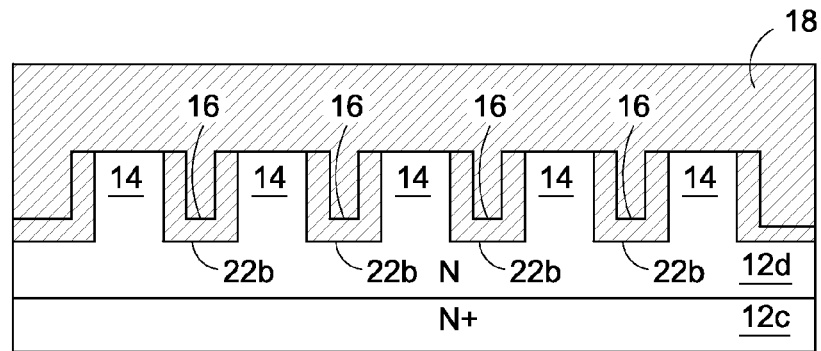
Figure 1F:
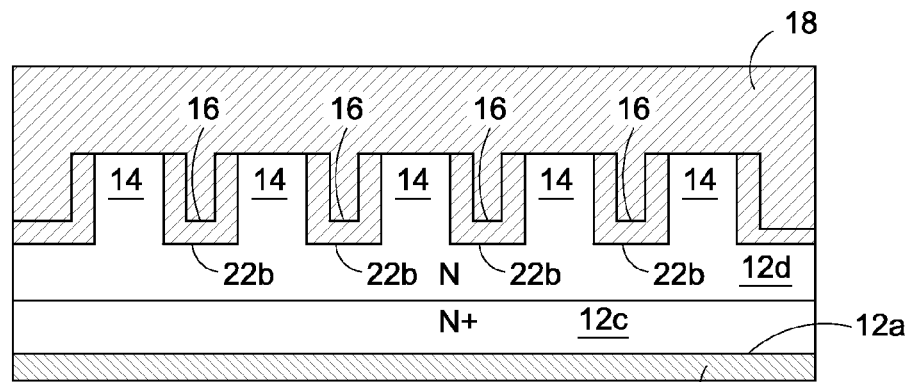
Figure 2A:
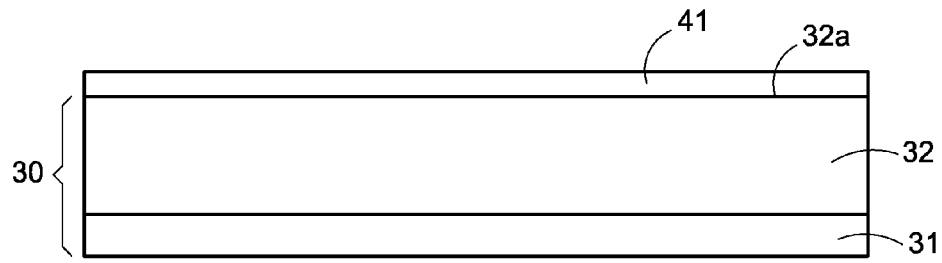
FIGS. 2A to 2R illustrate the method for manufacturing the semiconductor device (such as Schottky diode) with multi-trench termination structure according to a preferred embodiment of the present invention.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed. FIGS. 2A to 2R illustrate the method for manufacturing the semiconductor device (such as Schottky diode) with multi-trench termination structure according to a preferred embodiment of the present invention. Please note that the article "a" or "an" may be used for some elements, but the number of the elements is not limited to "one".

Referring to FIG. 2A, a semiconductor substrate 30 is first provided. In this embodiment, the semiconductor substrate 30 includes a relatively heavily-doped silicon substrate 31 and a relatively lightly-doped epitaxial layer 32. For the purpose of description, the epitaxial layer 32 shown in FIG. 2A is thicker than the silicon substrate 31 for a subsequent etching process to form a multi-trench structure. In more realistic situation, however, the epitaxial layer 32 formed on the silicon substrate 31 is thinner than the silicon substrate 31.

A thermal oxidation process is then performed on a surface 32a of the semiconductor substrate 30 (namely, the surface of the epitaxial layer 32) to form a first oxide layer 41. In an embodiment, the first oxide layer 41 is a silicon oxide layer having a specific thickness around, for example but not limited to, 6000 angstroms. It should be noted that above thickness is only for demonstration, and the actual thickness of the first oxide layer 41 is determined in view of the depth of later-formed trenches and the designed reverse voltage tolerance of the semiconductor device.

Figure 2B:
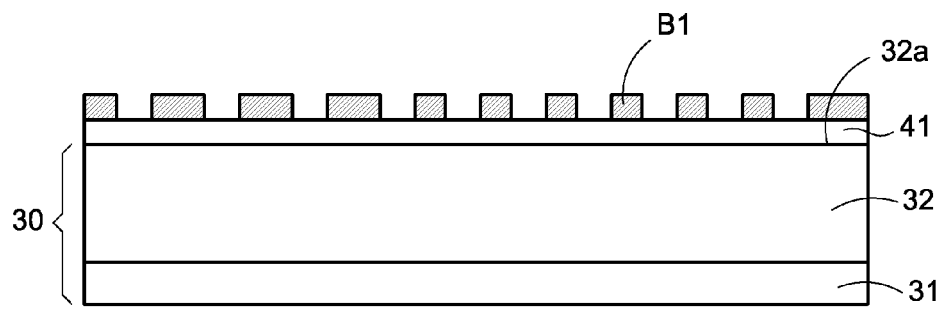
Figure 2C:
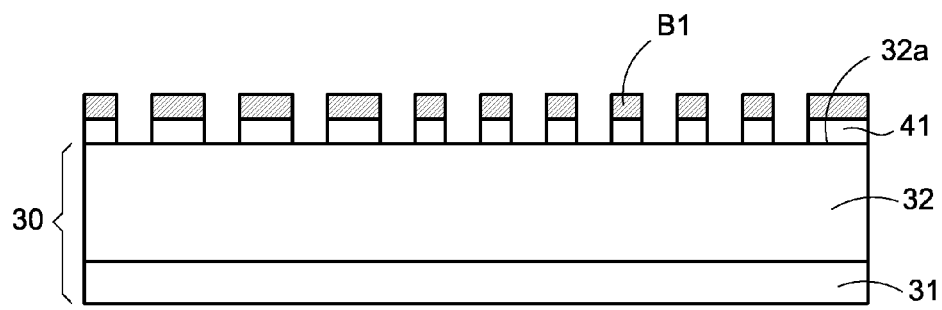
Figure 2D:
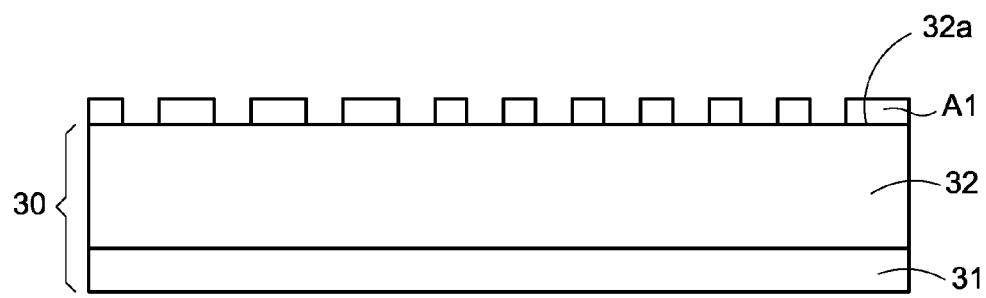
Figure 2E:
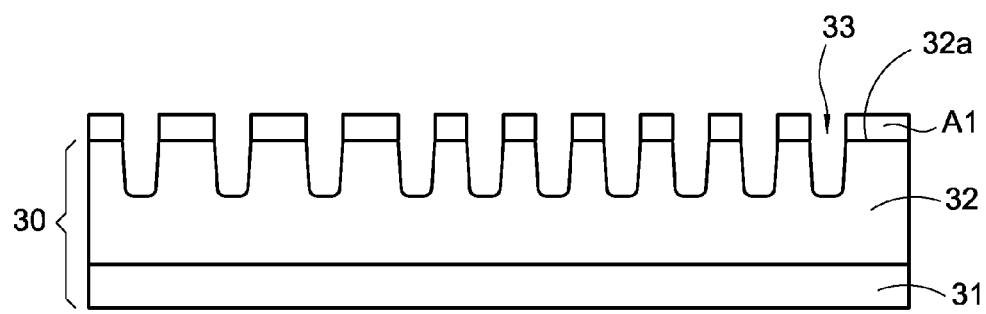

As illustrated in FIG. 2B, a first photoresist layer B1 having a first pattern is formed on the first oxide layer 41. Using the first photoresist layer B1 as a mask during an etching process, the first oxide layer 41 is patterned according to the first pattern, so that the first pattern of the first photoresist layer B1 is transferred onto the first oxide layer 41 to form the mask layer A1, as shown in FIG. 2C and FIG. 2D. The mask layer A1 will serve as a hard mask during another etching process to form a multi-trench structure in the semiconductor substrate 30. In some embodiments, the etching process for patterning the first oxide layer 41 to form the mask layer A1 may be a dry etching process. In another embodiment, the first oxide layer 41 is formed by a chemical vapor deposition (CVD) process After the mask layer A1 is formed on the semiconductor substrate 30, the first photoresist layer B1 is then stripped off, as shown in FIG. 2D. FIG. 2E illustrates that a plurality of trenches 33 are formed in the semiconductor substrate 30 after a trench-etching process using the mask layer A1 is performed on the semiconductor substrate 30.

The trenches 33 are then subjected to a trench rounding process to smooth the rough surfaces on the trench bottoms and trench sidewalls of the multi-trench structure. Reducing the roughness of the surfaces of the trenches 33 may increase performance of oxide layers formed on the surfaces.

Figure 2F:
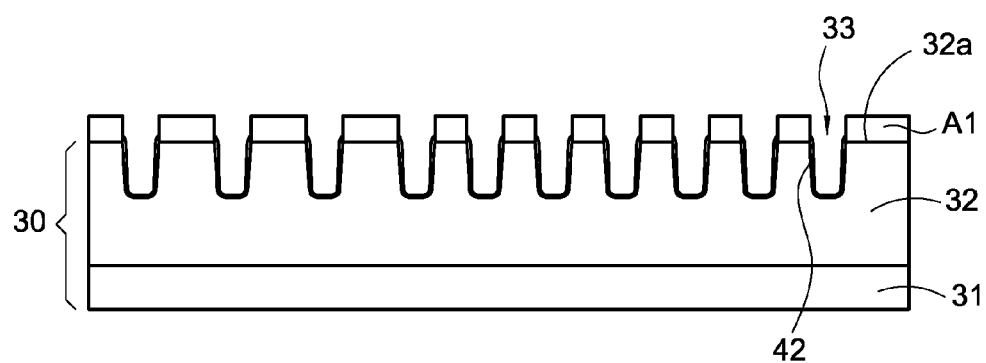

In an embodiment, the trench rounding process includes several steps. First at all, a downward dry etching step is performed on the surfaces of the trenches 33 to remove about several hundred angstroms of the semiconductor substrate 30 through the trenches 33. The slight etching can significantly smooth the surfaces of the trenches 33. A second oxide layer 42 is subsequently formed on the inner surfaces of the trenches 33 (i.e. on the trench bottoms and trench sidewalls), as shown in FIG. 2F. The second oxide layer 42 is a thin layer serving as a sacrificial oxide layer. After removing the second oxide layer 42, the smoothness of the surfaces of the trenches 33 are further improved.

Figure 2G:
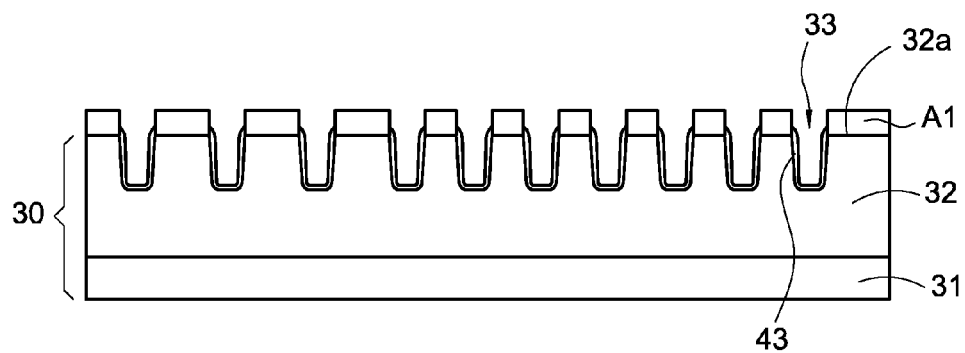

After the second oxide layer 42 is stripped off, a gate insulation layer 43 is formed on the trench bottoms and trench sidewalls (FIG. 2G). The gate insulation layer can be, for example, a gate oxide layer or a gate nitride layer. For the purpose of demonstration, the gate insulation layer 43 is exemplified as gate oxide layer 43 in the following description. It should be noted that the specific example is not intended to limit the scope of the present invention. In an embodiment, the gate oxide layer 43 extends upwards along the trench sidewalls and protrudes above the surface 32a of the semiconductor substrate 30. In other words, the protruding portion of the gate oxide layer 43 is in contact with a lower sidewall portion of the mask layer A1 as shown in FIG. 2G.

Figure 2H:
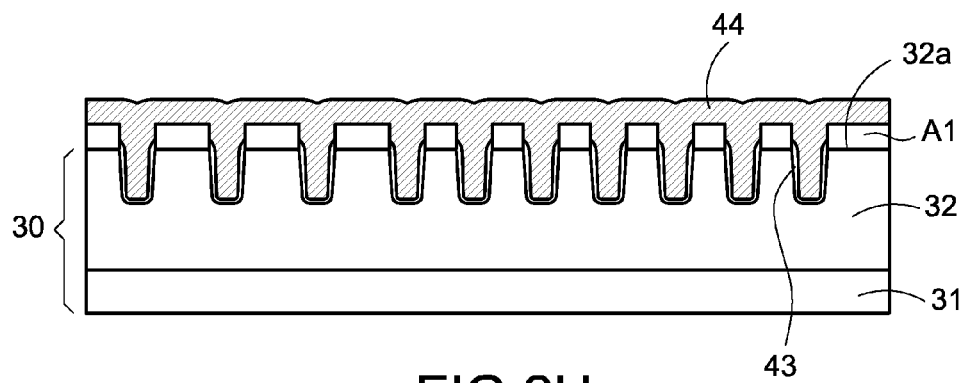

After the gate oxide layer 43 is formed on the surface of the trenches 33, an electrically conductive structure (electrically conductive layer) 44 is formed on the gate oxide layer 43 and the mask layer A1, as shown in FIG. 2H. The conductive structure 44 can be a polysilicon structure (polysilicon layer) or a metallic structure (metallic layer), and is exemplified as a polysilicon structure for demonstration in later description. It should be noted that the specific example is not intended to limit the scope of the present invention. In an embodiment, the polysilicon structure 44 is formed by a CVD process. Thus, the trenches 33 are filled with the polysilicon structure 44, and the polysilicon structure 44 further covers part of the mask layer A1 (more particularly, the top face of the mask layer A1 and the upper sidewall portion of the mask layer A1, which is not covered by the gate oxide layer 43).

Figure 2I:
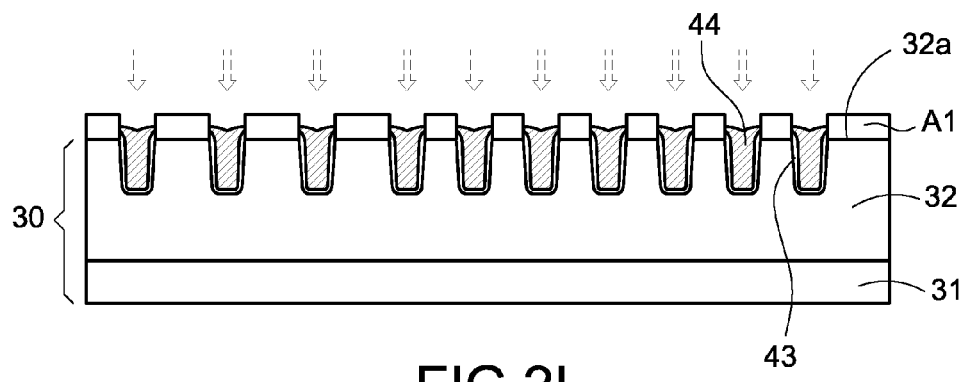

Subsequently, a portion of the polysilicon structure 44 is removed by an etch-back process. No photoresist is required in this downward dry etching (etch-back) process. The polysilicon structure 44 is uniformly etched and the etching depth depends on etching time. As depicted in FIG. 2I, the etch-back process exposes the top surfaces and a portion of the sidewalls of the mask layer A1. Please note that the sidewalls of the mask layer A1 are in contact with the gate oxide layer 43 or the remaining polysilicon structure 44 after the etch-back process.

Then, an ion implantation process is performed to introduce impurities into the polysilicon structure 44. In an embodiment, boron or phosphorous ions are uniformly implanted with a predetermined depth in the polysilicon structure 44, so as to form a P-type or an N-type area in the polysilicon structure 44. Moreover, the growth steps of the polysilicon structure 44 and the ion implantation depicted in FIGS. 2H-2J can also be replaced by in situ growth process of polysilicon structure 44. Namely, the required impurities are added in the in situ growth process of polysilicon structure 44 to provide impurity concentration for realizing later Schottky energy barrier of the Schottky diode.

Figure 2J:
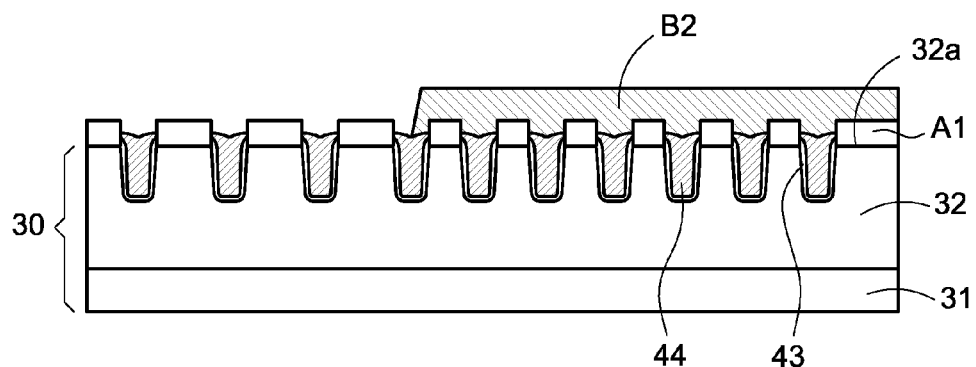
Figure 2K:
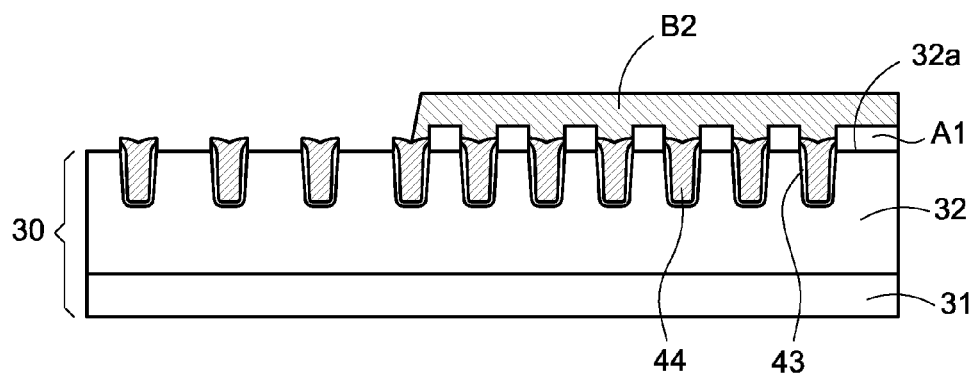
Figure 2L:
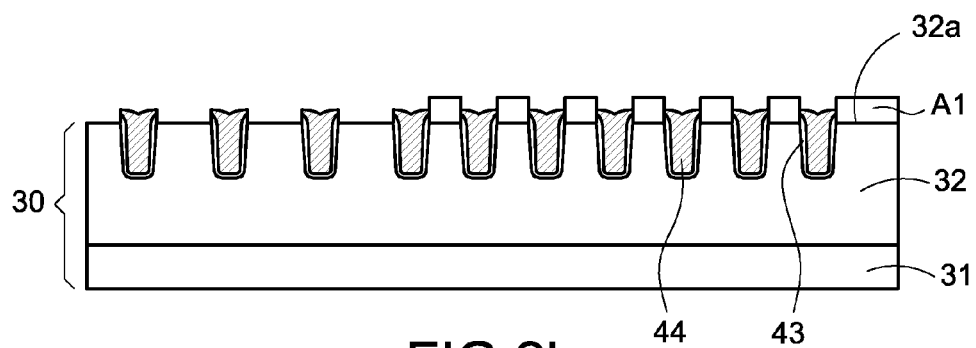

Afterward, as shown in FIG. 2J, a second photoresist layer B2 having a second pattern is formed on the resulting structure, and then an etching step is performed with the second photoresist layer B2 as etch mask. As shown in FIG. 2K, the portion not covered by the second photoresist layer B2 (on left side of the drawing, for example) belongs to active structure region of the trench Schottky diode, while the portion covered by the second photoresist layer B2 (on right side of the drawing, for example) belongs to termination structure region of the trench Schottky diode. The termination structure region of the trench Schottky diode can function as guard ring for the trench Schottky diode. In above-mentioned etching step, the mask layer A1 in the active structure region of the trench Schottky diode can be removed, and the mask layer A1 in the termination structure region of the trench Schottky diode still remains. In other words, the etching step exposes the semiconductor substrate 30, the polysilicon structure 44 and part of the gate oxide layer 43 on the left side of the shown trench Schottky diode. Afterward, the second photoresist layer B2 is removed as shown in FIG. 2L.

After the photoresist removing step, a metal sputtering process or a metal evaporation process is performed on the resulting structure to form the metal layer 50. For the ease of demonstration, the metal layer 50 is exemplified as the metal sputtering layer 50 formed by a metal sputtering process. It should be noted that the claims of the present invention is not limited by the specific example. In the shown example, the metal sputtering layer 50 includes a first metal layer 51 and a second metal layer 52. The formation of the first metal layer 51 and the second metal layer 52 are respectively described as follows. A metal sputtering process is first performed at least on the exposed face of the semiconductor substrate 30, the mask layer A1, and the polysilicon structure 44 to form the first metal layer 51. Therefore, the whole wafer is blanketed by the first metal layer 51. In an embodiment, the first metal layer 51 is made of titanium (Ti).

Figure 2M:
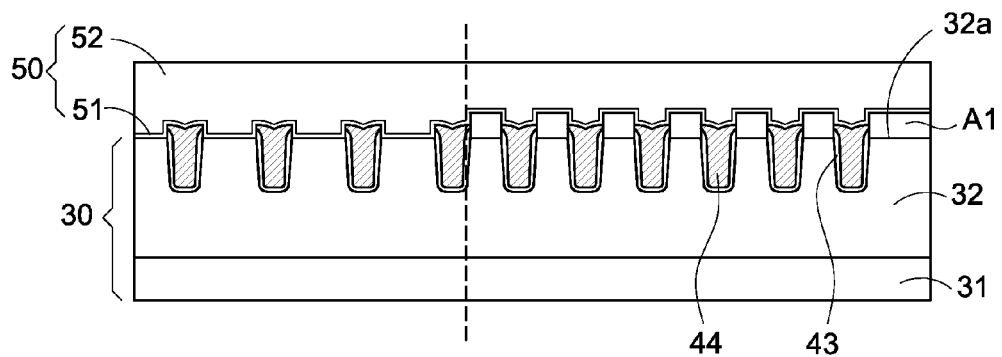

Subsequently, another metal sputtering process is performed on the first metal layer 51 to form the second metal layer 52 covering the first metal layer 51. The second metal layer 52, which is made of an alloy of aluminum, silicon and copper (Al/Si/Cu), is sputtered onto the first metal layer 51. Hence, the first metal layer 51 and the relatively lightly-doped epitaxial layer 32 are in contact with each other, which forms a Schottky contact or a Schottky barrier on the surface 32a (located on left side of FIG. 2M). Moreover, an optional rapid thermal processing (RTP) step can be performed after the formation of the second metal layer 52.

Figure 2N:
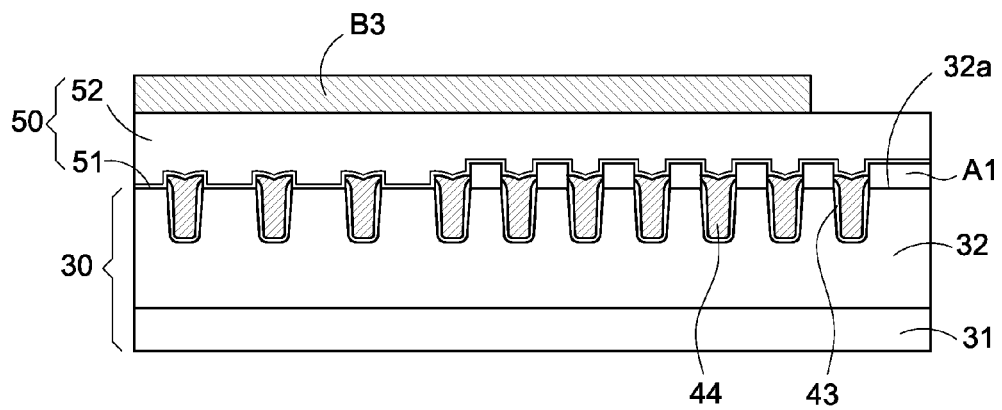
Figure 2O:
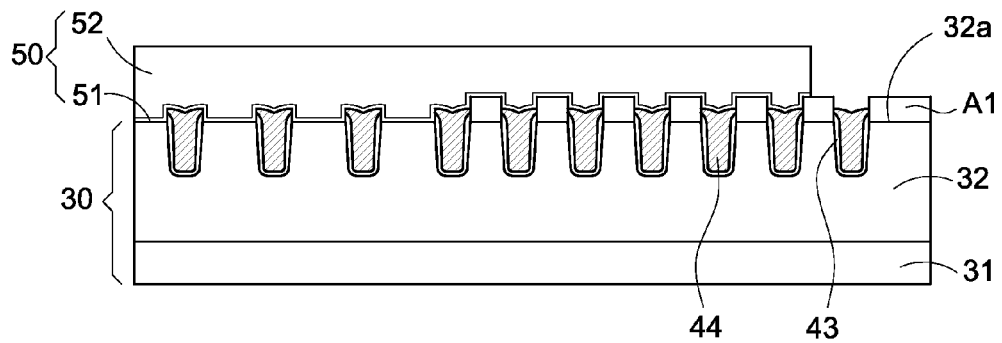

After the metal sputtering layer 50 is formed, a third photoresist layer B3 having a third pattern is formed on the metal sputtering layer 50, as shown in FIG. 2N, to transfer the third pattern onto the metal sputtering layer 50. A portion of the metal sputtering layer 50 is etched off to optionally expose part of the trenches 33 and the mask layer A1 on peripheral portion. Afterward, the third photoresist layer B3 is stripped off, and the resultant structure of a trench Schottky diode is shown in FIG. 2O.

The above-mentioned etching process adopts a metal etching process to etch the metal sputtering layer 50 composed of the first metal layer 51 and the second metal layer 52 with respect to the portion uncovered by the third photoresist layer B3. Therefore, part of the trenches 33 are exposed (namely those trenches 33 shown in right side of FIG. 2O), and the number of the trenches 33 located in the termination structure region and covered by the metal sputtering layer 50 is corresponding to the required reverse voltage tolerance of the trench Schottky diode. Besides, a sintering process may be performed after the metal etching process to enhance adhesion of the metal sputtering layer 50 to the semiconductor substrate 30 and the polysilicon structure 44.

Figure 2P:
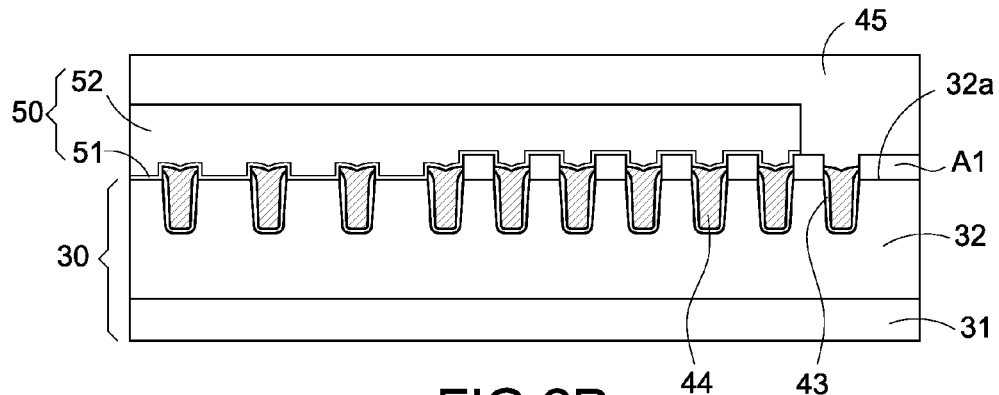

Afterward, as shown in FIG. 2P, a passivation layer 45 is formed on the resulting structure. According to an example of the present invention, the passivation layer 45 can be, for example, a borophosphosilicate glass (BPSG) layer 45. BPSG is a type of silicate glass including boron and phosphorous impurities. The BPSG layer 45 has a lower melting point than other oxide layers. When the BPSG layer 45 is heated above the glass-transition temperature (e.g. above 800 C.), the BPSG layer 45 starts to "flow slowly". Accordingly, the BPSG layer 45 can provide a planar profile due to its "fluidity", as shown in FIG. 2P. Moreover, the passivation layer 45 can also be realized by Tetraethoxysilane (TEOS) or silicon nitride.

Figure 2Q:
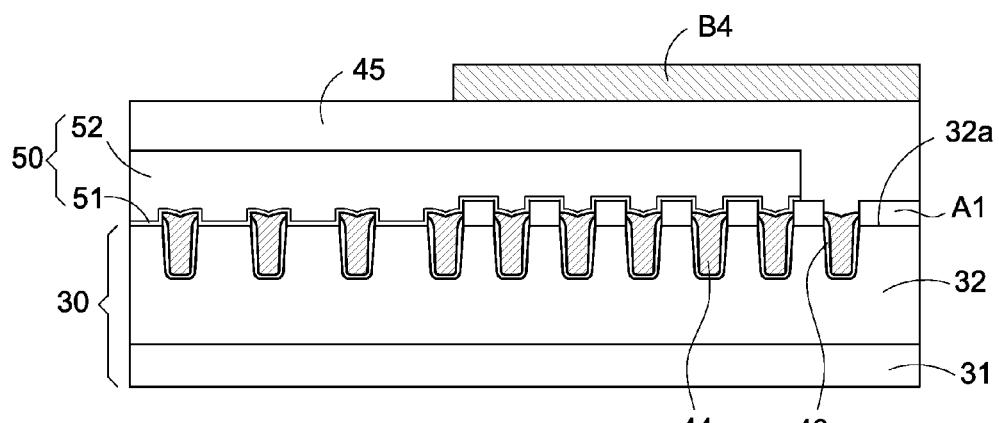
Figure 2R:
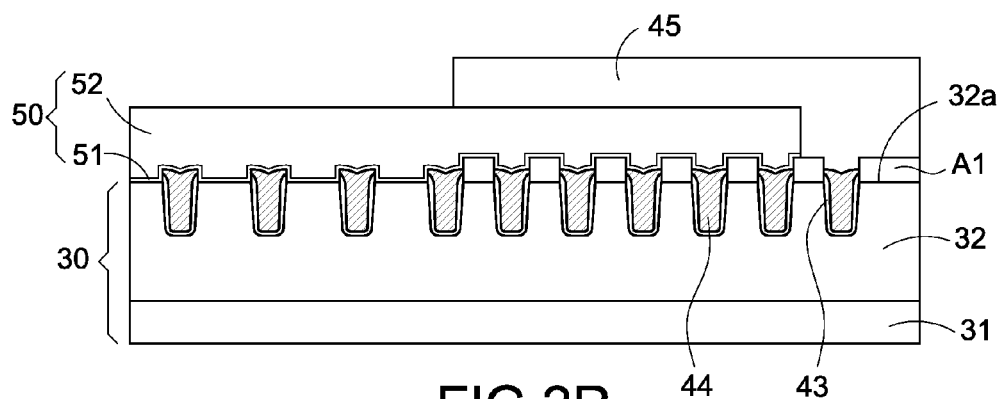

Afterward, as shown in FIG. 2Q, a fourth photoresist layer B4 having a fourth pattern is formed on the surface of the passivation layer 45, and the fourth photoresist layer B4 substantially covers the area of the trench Schottky diode, which is corresponding to the termination structure region. As shown in FIG. 2R, the portion of the passivation layer 45, which is not covered by the fourth photoresist layer B4, is etched away to expose the underlying metal sputtering layer 50. Afterward, the fourth photoresist layer B4 is removed to form the Schottky diode with multi-trench termination structure according to the present invention.

Finally, a wafer acceptance test (WAT) is conducted to test the electric characteristics of the wafer fabricated by above-mentioned processes.

FIG. 2R illustrates the structure of the semiconductor device manufactured according to the above-mentioned method, where the semiconductor device can be at least one of Schottky diode, thyristor, pn junction diode, or MOSFET. As shown in the figure, the semiconductor device mainly comprises an active structure region on left side and a termination structure region with multiple trenches on right side of the wafer. The multi-trench termination structure according to the present invention mainly comprises a semiconductor substrate 30, a first mask layer A1, a gate insulation layer 43 (such as a gate oxide layer 43), an electrically conductive layer 44 (such as a polysilicon layer 44), and a metal layer 50 (such as the metal sputtering layer 50). The semiconductor substrate 30 has a multi-trench structure with a plurality of trenches 33 thereon. The first mask layer A1 is arranged on the exposed face 32a of the semiconductor substrate 30 and adjacent to the trenches 33. The gate insulation layer 43 is formed on the inner face of the trenches 33 and has a portion extruding out of the exposed face 32a of the semiconductor substrate 30. The electrically conductive layer 44 is formed on the gate insulation layer 43 and protrudes out of the exposed face 32a of the semiconductor substrate 30. The metal layer 50 composed of the first metal layer 51 and the second metal layer 52 is arranged on the surface of the first mask layer A1 and the electrically conductive layer 44.

In comparison with the prior art semiconductor device, the semiconductor device with multi-trench termination structure has higher reverse voltage tolerance. Taking the Schottky diode as an exemplified semiconductor device, the area outside the Schottky barrier has a multi-trench termination structure, the reverse voltage tolerance of the Schottky diode can be enhanced. More particularly, the metal layer 50 in the multi-trench termination region is in direct contact with the electrically conductive layer 44 to effectively spread the electric field in the Schottky diode. The reverse voltage tolerance can be tailored to be higher with more trenches. Moreover, the metal layer 50 in the multi-trench termination region is not in contact with the exposed face 32a of the semiconductor substrate 30 because the metal layer 50 and the semiconductor substrate 30 are separated by the first mask layer A1 and the gate insulation layer 43. Therefore, Schottky barrier is not present in the multi-trench termination region, and the electrical property of the Schottky diode is not influenced.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A method of manufacturing a multi-trench termination structure for a semiconductor device consisting of an active structure region and a termination structure region, the method comprising:
   (a) providing a semiconductor substrate of the semiconductor device;
   (b) forming a mask layer on the semiconductor substrate;
   (c) forming a multi-trench structure with a plurality of trenches by etching the semiconductor substrate with respect to the mask layer;
   (d) forming a gate insulation layer on the multi-trench structure;

(e) forming an electrically conductive layer on the gate insulation layer, and etching back the electrically conductive layer until a top face of the electrically conductive layer is lower than a top face of the mask layer, the electrically conductive layer being higher than the gate insulation layer and in contact with the mask layer at edge of the trench;

(e1) removing part of the mask layer at the active structure region such that the mask layer is remained on location corresponding to the termination structure region only;

(f) forming a metal layer covering the electrically conductive layer at the active structure region, and covering the mask layer and the electrically conductive layer at the termination structure region; and (g) forming a passivation layer covering the metal layer at the termination structure region only, wherein the passivation layer is in direct contact with the mask layer and the electrically conductive layer at a peripheral of the termination structure region.

2. The method in claim 1, wherein the semiconductor substrate comprises a relatively heavily-doped silicon substrate and a relatively lightly-doped epitaxial layer.

3. The method in claim 1, wherein step (b) further comprises:
   forming a first oxide layer on the semiconductor substrate;
   forming a first photoresist layer having a first pattern on the first oxide layer;
   etching the first oxide layer with respect to the first photoresist layer to transfer the first pattern to the first oxide layer and form the mask layer.

4. The method in claim 3, wherein the first pattern is corresponding to a pattern of the multiple trenches.

5. The method in claim 1, wherein the electrically conductive layer is a polysilicon layer or a metallic layer.

6. The method in claim 5, performing an ion implantation process after the electrically conductive layer being a polysilicon layer.

7. The method in claim 1, wherein the step (f) further comprises:
   performing a metal sputtering or a metal evaporating process after step (e) to form a first metal layer;
   performing a metal sputtering or a metal evaporating process on the first metal layer to form a second metal layer, wherein the first metal layer and the second metal layer constitute the metal layer.

8. The method in claim 7, wherein the first metal layer is made of Ti, and the second metal layer is made of an Al/Si/Cu alloy.

9. The method in claim 1, wherein the gate insulation layer is a gate oxide layer or a gate nitride layer.

10. The method in claim 1, wherein the semiconductor device is a Schottky diode, a thyristor, a pn junction diode, or a MOSFET (metal-oxide-semiconductor field-effect transistor).

* * * * *